(12) United States Patent
Adusumilli et al.

(10) Patent No.: US 10,546,941 B2
(45) Date of Patent: Jan. 28, 2020

(54) FORMING THERMALLY STABLE SALICIDE FOR SALICIDE FIRST CONTACTS

(71) Applicant: INTERNATIONAL BUSINESS MACHINES CORPORATION, Armonk, NY (US)

(72) Inventors: Praneet Adusumilli, Albany, NY (US); Emre Alptekin, Wappingers Falls, NY (US); Christian Lavoie, Pleasantville, NY (US); Ahmet S. Ozcan, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/806,899

(22) Filed: Nov. 8, 2017

(65) Prior Publication Data
US 2018/0308952 A1    Oct. 25, 2018

Related U.S. Application Data

(63) Continuation of application No. 15/492,418, filed on Apr. 20, 2017.

(51) Int. Cl.
| | |
|---|---|
| H01L 29/66 | (2006.01) |
| H01L 21/285 | (2006.01) |
| H01L 21/8234 | (2006.01) |
| H01L 29/78 | (2006.01) |
| H01L 29/04 | (2006.01) |
| H01L 29/08 | (2006.01) |

(52) U.S. Cl.
CPC ...... *H01L 29/665* (2013.01); *H01L 21/28518* (2013.01); *H01L 21/823431* (2013.01); *H01L 29/66545* (2013.01); *H01L 29/66795* (2013.01); *H01L 29/785* (2013.01); *H01L 21/823425* (2013.01); *H01L 21/823475* (2013.01); *H01L 29/045* (2013.01); *H01L 29/0847* (2013.01); *H01L 2029/7858* (2013.01)

(58) Field of Classification Search
None
See application file for complete search history.

(56) References Cited

U.S. PATENT DOCUMENTS

| | | |
|---|---|---|
| 5,043,300 A | 8/1991 | Nulman |
| 5,744,395 A | 4/1998 | Shue et al. |
| 5,953,633 A | 9/1999 | Chen et al. |
| 6,087,234 A | 7/2000 | Wu |

(Continued)

OTHER PUBLICATIONS

List of IBM Patents or Patent Applications Treated as Related dated Nov. 8, 2017, 2 pages.

*Primary Examiner* — Bo B Jang
(74) *Attorney, Agent, or Firm* — Tutunjian & Bitetto, P.C.; Vazken Alexanian

(57) ABSTRACT

A method for forming a salicide includes epitaxially growing source/drain (S/D) regions on a semiconductor fin wherein the S/D regions include (111) facets in a diamond shape and the S/D regions on adjacent fins have separated diamond shapes. A metal is deposited on the (111) facets. A thermally stabilizing anneal process is performed to anneal the metal on the S/D regions to form a silicide on the (111) facets. A dielectric layer is formed over the S/D regions. The dielectric layer is opened up to expose the silicide and to form contact holes. Contacts to the silicide are formed in the contact holes.

18 Claims, 8 Drawing Sheets

(56) References Cited

U.S. PATENT DOCUMENTS

| | | | |
|---|---|---|---|
| 6,811,448 B1 | 11/2004 | Paton et al. | |
| 7,892,971 B2 | 2/2011 | Hwang et al. | |
| 8,088,665 B2 | 1/2012 | Rachmady et al. | |
| 8,999,831 B2 | 4/2015 | Ando et al. | |
| 2001/0045597 A1* | 11/2001 | Nishinohara | H01L 29/66545 |
| | | | 257/329 |
| 2007/0123042 A1 | 5/2007 | Rim et al. | |
| 2015/0097250 A1* | 4/2015 | Cheon | H01L 27/0886 |
| | | | 257/401 |
| 2016/0020208 A1 | 1/2016 | Anderson et al. | |
| 2016/0087062 A1* | 3/2016 | Yin | H01L 29/4916 |
| | | | 257/344 |
| 2016/0093741 A1* | 3/2016 | Yang | H01L 29/7853 |
| | | | 257/288 |
| 2016/0308004 A1* | 10/2016 | Lee | H01L 29/0847 |
| 2017/0194210 A1* | 7/2017 | Oh | H01L 21/82345 |

* cited by examiner

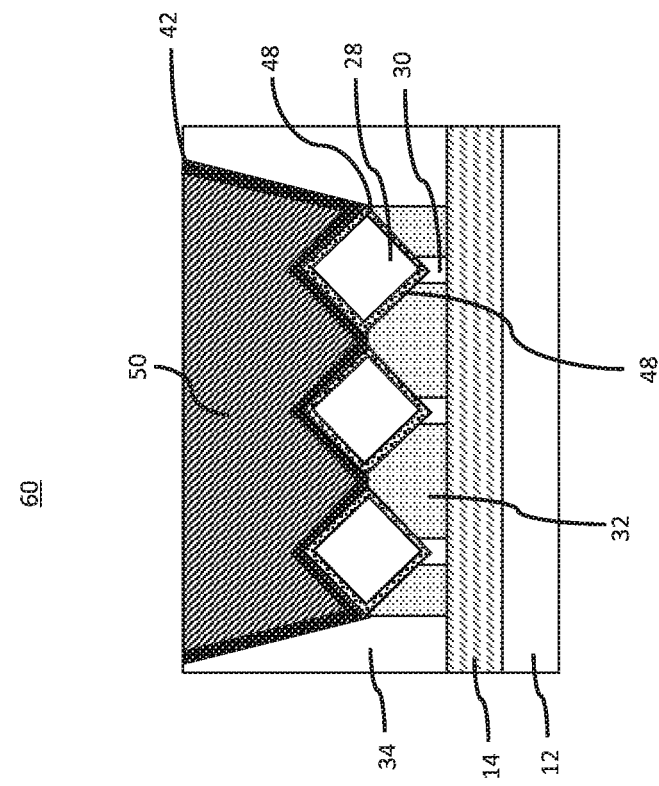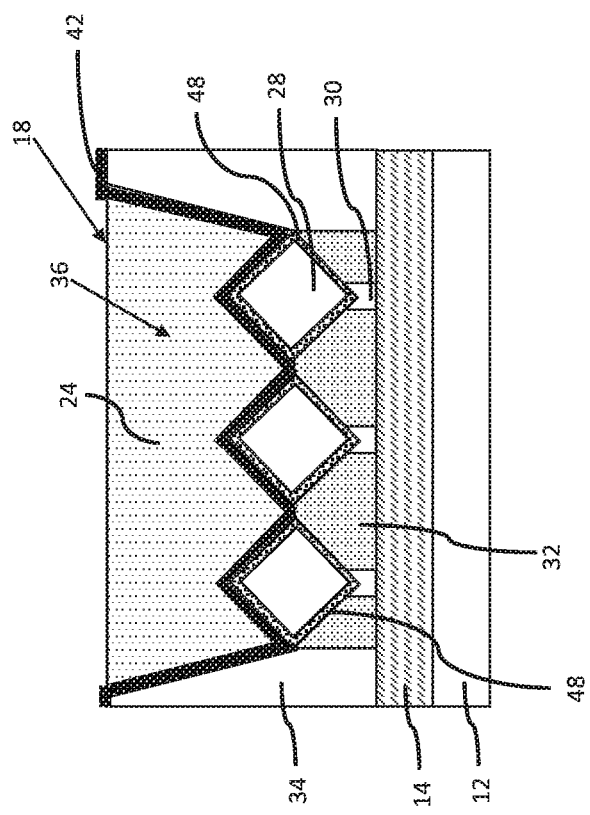

FORMING THERMALLY STABLE SALICIDE FOR SALICIDE FIRST CONTACTS

BACKGROUND

Technical Field

The present invention generally relates to semiconductor processing, and more particularly to self-aligned contacts and their formation using thermally stable metal silicon mixtures.

Description of the Related Art

For ever-decreasing node sizes, replacement metal gate (RMG) and trench silicide processes have been employed to permit the use of smaller critical dimensions. The use of these structures can result in the need for fully strapped contacts in order to reduce contact resistance. Complications arise from forming silicides through a trench. The formation of such silicides are often restricted by thermal budget, preclean processing and high aspect ratio constraints.

SUMMARY

In accordance with an embodiment of the present invention, a method for forming a salicide includes epitaxially growing source/drain (S/D) regions on a semiconductor fin wherein the S/D regions include (111) facets in a diamond shape and the S/D regions on adjacent fins have separated diamond shapes. A metal is deposited on the (111) facets. A thermally stabilizing anneal process is performed to anneal the metal on the S/D regions to form a silicide on the (111) facets. A dielectric layer is formed over the S/D regions. The dielectric layer is opened up to expose the silicide and to form contact holes. Contacts to the silicide are formed in the contact holes.

Another method for forming a silicide includes forming gate structures with a dummy gate material; epitaxially growing source/drain (S/D) regions on a semiconductor fin wherein the S/D regions include (111) facets in a diamond shape and the S/D regions on adjacent fins have separated diamond shapes; depositing a metal on the (111) facets; annealing the metal on the S/D regions to form a silicide on the (111) facets; replacing a dummy gate material with a metal gate conductor after the annealing step; forming a dielectric layer over the S/D regions; opening up the dielectric layer to expose the silicide and to form contact holes; and forming contacts to the silicide in the contact holes.

A semiconductor device includes an epitaxially grown source/drain (S/D) regions formed on a semiconductor fin on opposite sides of a transversely disposed gate structure, the S/D regions including (111) facets in a diamond shape wherein epitaxial material of adjacent diamond shapes is separated in a non-merged configuration. A silicide is formed on the (111) facets. A dielectric layer is formed over the S/D regions and the gate structure. Contacts are formed through the dielectric layer to the silicide in the contact holes.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein:

FIG. 9 is a cross-sectional view of the device of FIG. 8 showing a dielectric layer opened up to form a contact hole and a barrier layer conformally formed in accordance with an embodiment of the present invention;

FIG. 10 is a cross-sectional view of the device of FIG. 9 showing the dielectric layer filled with metal to form a contact in accordance with an embodiment of the present invention;

DETAILED DESCRIPTION

Figure 2:
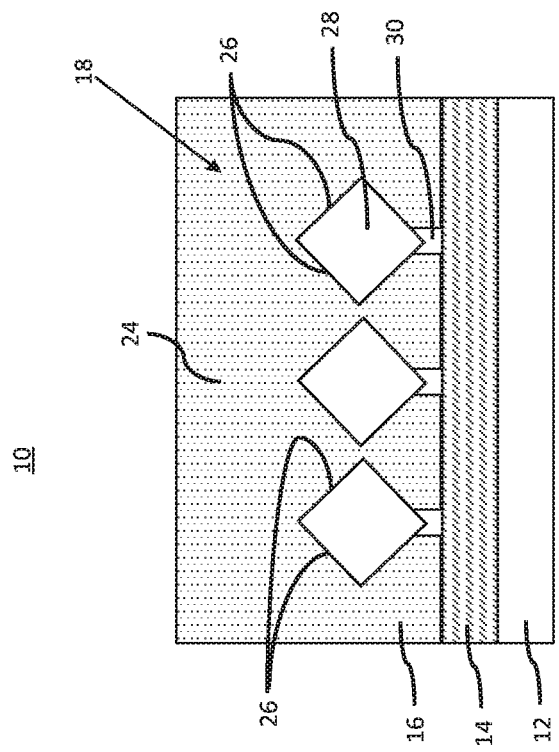
FIG. 2 is a cross-sectional view taken at section line 2-2 of FIG. 1 showing source/drain regions grown on fins and having non-merged diamond shapes in accordance with an embodiment of the present invention.

Embodiments of the present invention provide silicide or salicide (self-aligned silicide) formation for contacts or to other device structures. Structures and methods are included that form an early salicide contact with high thermal and morphological stability to reduce contact resistance as well as effective capacitance in field effect transistor (FET) devices, e.g., FinFETs. Early salicide refers to forming the salicide before metal gate replacement. The silicide or salicide is thermally stable for replacement metal gate (RMG) processing thermal budgets (e.g., around 1000 degrees C. spike anneals). The present embodiments provide ways of reducing contact resistance with contact length engineering (e.g., wrap around contacts, gouge free contacts, etc.) and contact to gate capacitance scaling with partially strapped contacts on salicided source and drain (S/D) regions. In addition, the silicide or salicide simplifies middle of the line (MOL) contact modules by eliminating the need for liner metallization, contact preclean processing and contact anneals.

In useful embodiments, gate structures, gate spacers, and source/drain (S/D) regions are formed followed by an optional spacer reactive ion etch (RIE) to open up all S/D contacts (or for contacts of one type of field effect transistor (FET), e.g., n or p). Epitaxial growth of the S/D regions can include formation of diamond epitaxy with <111> surfaces exposed during silicide formation. The preservation and use of the (111) facets with non-merged S/D regions enables reduced contact resistance by avoiding higher resistance crystal structures (e.g., (100) facets).

After formation of the S/D regions, an anneal such as a laser spike anneal (LSA) can be performed followed by an optional soak anneal to complete the silicide formation where the LSA anneal preference is 900 degrees C. to 1100 degrees C. for $TiSi_x$ and can be different for other high melting silicides of interest (e.g., Co, Ta, etc.).

Since salicide is formed prior to (hence referred to as "early salicide") the replacement metal gate (RMG) deposition, higher thermal budgets can be used for silicide formation. This permits for thicker metal deposition and thus a thicker silicide formation.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Figure 1:
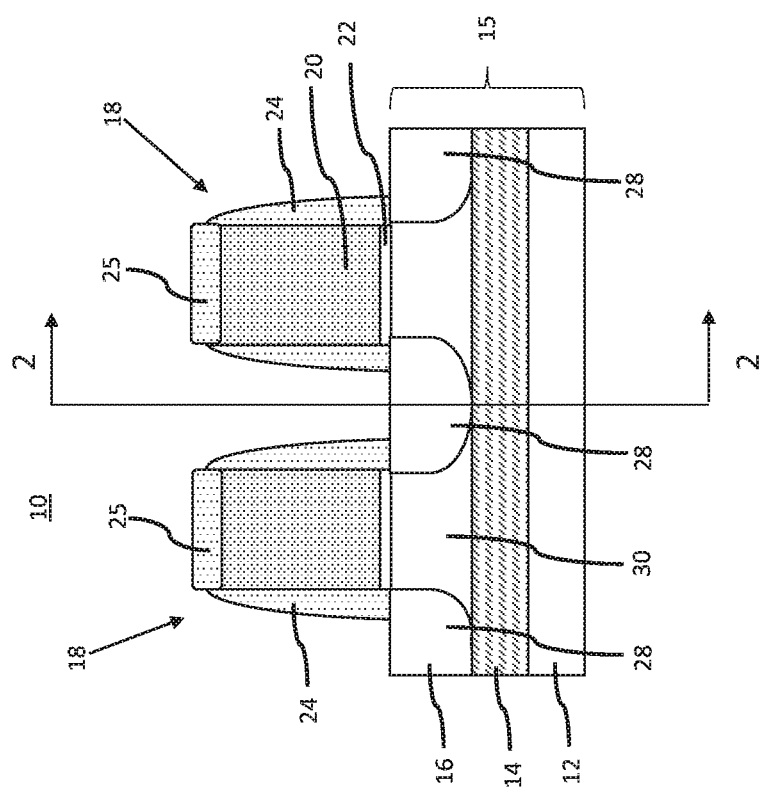
FIG. 1 is a cross-sectional view taken transversely through gate structures of a semiconductor device in accordance with an embodiment of the present invention.

Referring now to the drawings in which like numerals represent the same or similar elements and initially to FIG. 1, a cross-sectional view is shown taken transversely through gate structures 18 in a partially fabricated semiconductor device 10. The semiconductor device 10 includes a substrate 15 having multiple layers. The substrate 15 can include any suitable substrate structure, e.g., a bulk semiconductor, a semiconductor-on-insulator (SOI) substrate, etc. In one example, the substrate 15 can include a silicon-containing base material 12. Illustrative examples of Si-containing materials suitable for the base 12 can include, but are not limited to, Si, SiGe, SiGeC, SiC and multi-layers thereof. Although silicon is the predominantly used semiconductor material in wafer fabrication, alternative semiconductor materials can be employed instead or as additional layers, such as, but not limited to, germanium, gallium arsenide, gallium nitride, silicon germanium, cadmium telluride, zinc selenide, etc.

The SOI structure for substrate 15 further includes a buried dielectric layer 16 and a semiconductor layer 16. The buried dielectric layer 16 can include an oxide, such as, e.g., silicon oxide, although other dielectric materials can be employed. The semiconductor layer 16 can include, but is not limited to, Si, SiGe, SiGeC, SiC and multi-layers thereof. The semiconductor layer 16 is patterned using lithographic or other patterning techniques (e.g., spacer image transfer (SIT) etc.) to form fins 30, which are perpendicular (or at least transverse) in orientation relative to the gate structures 18.

Gate structures 18 include a gate dielectric 22, gate material 20, cap 25 and spacers 24. The gate dielectric can include an oxide formed with the semiconductor layer 16, although a dielectric layer can be deposited. The gate material 20 can include a dummy gate, which can include polysilicon or amorphous silicon. A dummy gate is employed in a gate last replacement metal gate (RMG) processing scheme. In such as process, the gate dielectric and the dummy gate are replaced after processing source and drain regions 28 and in some cases after contact silicide formation.

In other embodiments, the gate material 20 can include a gate conductor in a gate first processing scheme. The gate conductor 20 can include conductive materials, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

The cap 25 can include a portion of a hard mask employed to pattern the gate material 20. The cap 25 can include SiN or other dielectric materials. The spacers 24 are formed by depositing a conformal layer, e.g., SiN or other dielectric materials. A reactive ion etch (RIE) process removes the conformal dielectric layer from horizontal surfaces to form the spacers 24.

Referring to FIG. 2, a cross-sectional view is taken at section line 2-2 of FIG. 1 through the fins 30 between gate structures 18 in the partially fabricated semiconductor device 10. Fins 30 are exposed between gate structures 18. An epitaxial growth process is employed to grow diamond shaped S/D regions 28.

Epitaxial growth and/or deposition refers to the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a $\{100\}$ crystal surface will take on a $\{100\}$ orientation.

S/D epitaxy can be done by ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), molecular beam epitaxy (MBE). Epitaxial materials may be grown from gaseous or liquid precursors. Epitaxial materials may be grown using vapor-phase epitaxy (VPE), molecular-beam epitaxy (MBE), liquid-phase epitaxy (LPE), or other suitable process. Epitaxial silicon, silicon germanium (SiGe), and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from about $1\times10^{19}$ cm$^{-3}$ to about $2\times10^{21}$ cm$^{-3}$, or preferably between $2\times10^{20}$ cm$^{-3}$ and $1\times10^{21}$ cm$^{-3}$. When SiGe is epitaxially grown, the SiGe may have germanium content in the range of 5% to 80%, or preferably between 20% and 60%. In some embodiments, epitaxial growth and/or deposition processes are selective to forming on semiconductor surfaces, and generally do not deposit material on exposed dielectric surfaces, such as silicon dioxide or silicon nitride surfaces.

After S/D epitaxy is completed, a thin SiN spacer film (not shown) can be formed on the S/D regions 28. If the device 10 includes a complementary metal oxide semiconductor (CMOS) both n-type FETs (NFETs) and p-type FETs (PFETs) are processed separately to form the S/D regions 28. For example, the NFETs can include phosphorous (P) doped Si and the PFETs can include boron (B) doped SiGe regions. The thin SiN spacer film (not shown) can be formed over both NFETs and PFETs. In a cross-section parallel to the gate structure 18 as depicted in FIG. 2, the S/D regions 28 have a diamond shape with (111) facets 26 that are not merged with adjacent S/D regions 28. Not merged provides that the diamond shapes S/D regions 28 do not contact each other or run into each other and remain separate.

The SiN spacer film, if present, can be removed either by a short RIE process or a chemical non-RIE etch process (e.g., $NF_3$ based). This leaves the Si (111) (NFET) and SiGe (111) (PFET) facets 26 exposed.

Figure 3:
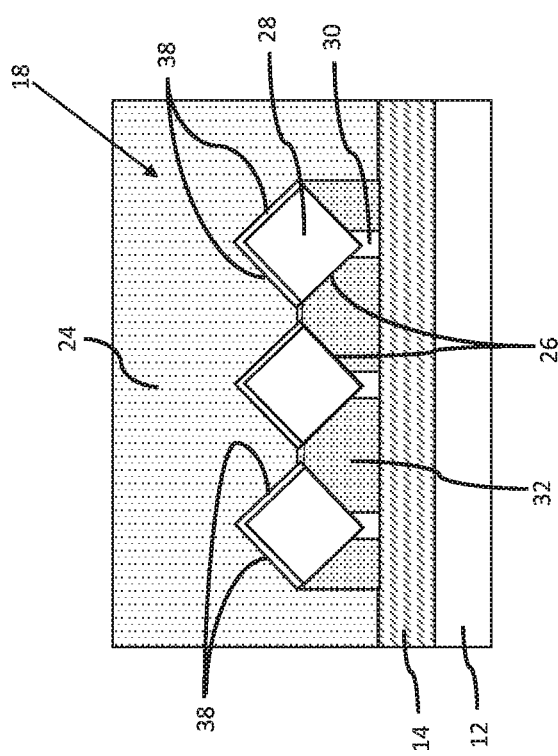
FIG. 3 is a cross-sectional view of the device of FIG. 2 showing a metal deposited over the source/drain regions in accordance with an embodiment of the present invention.

Referring to FIG. 3, in an early salicide embodiment, a local shallow trench isolation (LSTI) 32 is formed and etched to cover the fins 30 and lower facets 26 of the S/D regions 28. The LSTI 32 can include an oxide, such as silicon dioxide, although other dielectric materials can be employed.

A silicide metal 38 of desired thickness is deposited by one of a physical vapor deposition (PVD), chemical vapor deposition (CVD) or atomic layer deposition (ALD) process. The silicide metal 38 can include metals such as, e.g., Ti, Ta, Hf, Zr, Nb, alloys of these or other suitable metals, which can be employed to form high temperature silicides. The silicide metal 38 can be selected for different devices. For example, PFETs and NFETs may employed different silicide metals 38. The silicide metal 38 is formed over the (111) facets 26 of the S/D regions 28. In one embodiment, an optional barrier layer (not shown) can be conformally deposited over the device 10 on the silicide metal 38 over the facets 26. In one embodiment, the barrier layer includes TiN. In other embodiments, the barrier layers can include Ta, TaN, or other suitable materials.

The barrier layer or spacer film on top of the epi regions 28 can be removed using a gentle spacer RIE process or a dry chemical etch process with good selectivity to, e.g., Si/SiGe of the S/D regions 28. This will leave the surface significantly less damaged and with little or no residue. This is in contrast to typical contact RIE processes that leave the S/D region significantly damaged, gouged and with undesired oxidation or residues at the surface.

S/D epitaxial regions 28 are in the shape of diamonds with (111) facets 26 not merged as merging these regions produces (100) facets which should be avoided. Testing performed in accordance with the present invention has shown that, e.g., Ti germanosilicide films formed on SiGe (100) are more resistive and less thermally stable than those formed on (111) facets 26. This structure provides full entitlement of contact length on the upward facing facets 26 of S/D regions 28, particularly at ends of fins 30. This is normally a challenge in conventional trench salicide (TS) contacts, which do not provide full entitlement of contact length due to the misalignment of TS trench with the fin end. Thus, the structures provided in accordance with embodiments of the present invention provide a large reduction in contact resistance.

Figure 4:
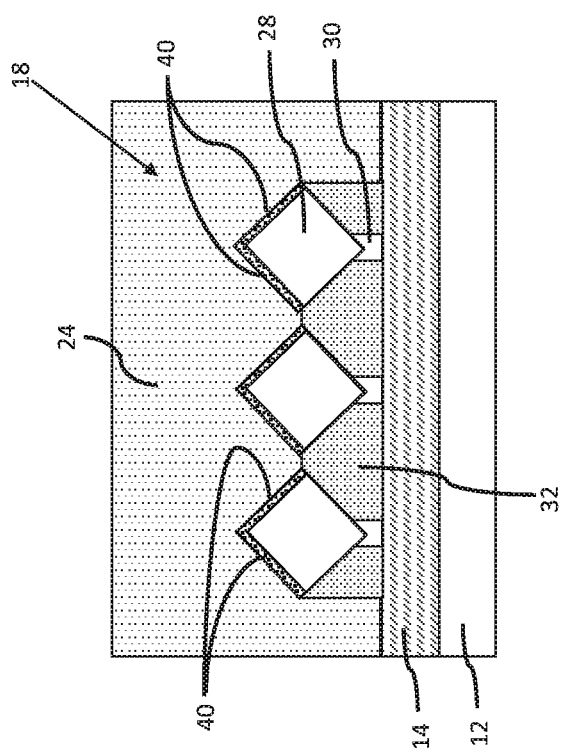
FIG. 4 is a cross-sectional view of the device of FIG. 3 showing a self-aligned silicide formed on top facets of the source/drain regions by annealing in accordance with an embodiment of the present invention.

Referring to FIG. 4, an anneal process is performed to react the metal 38 with the S/D regions 28. The anneal can include a rapid thermal anneal (RTA), a laser anneal (e.g., a laser spike anneal (LSA)) or a combination of anneals to form a salicide region 40. In one embodiment, a laser anneal includes a temperatures of between about 900 degrees C. to about 1100 degrees C. for between about 0.25 ms to about 1 ms. The selective removal of unreacted metal 38 is completed using a wet etch chemistry, e.g., a sulphuric peroxide mixture or a nitric acid etch. This quick anneal greatly increases thermal stability of the silicide. Additional annealing can be performed to provide sufficient silicide mixing.

Figure 5:
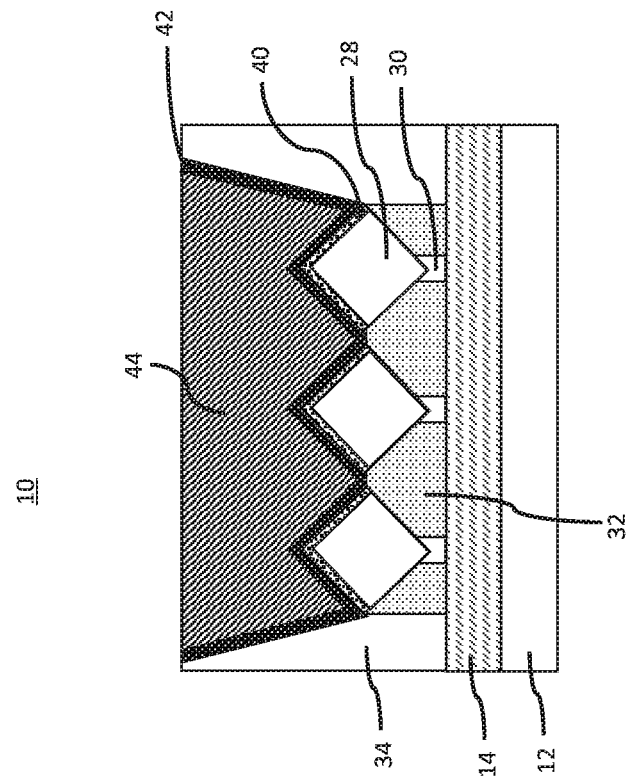
FIG. 5 is a cross-sectional view of the device of FIG. 4 showing a dielectric layer opened up to form a contact hole and a barrier layer conformally formed in accordance with an embodiment of the present invention.

Referring to FIG. 5, a dielectric layer 34 is formed over the device 10. The dielectric layer 34 can include an ultra-low-k (ULK) dielectric, although any suitable dielectric material can be employed. The dielectric layer 34 forms a middle of the line (MOL) interlevel dielectric layer (ILD). The dielectric layer 34 is planarized using, e.g., a chemical mechanical polish (CMP) process.

The gate structures 18 are then processed by performing a CMP process to open up the gate structures 18 to remove the dummy gate and perform replacement metal gate processing. For example, remove the dummy gate and gate oxide and replace the gate oxide with a gate dielectric and the dummy gate with a gate conductor.

Contact openings 36 are etched in accordance with an etch mask pattern to land on the S/D silicide regions 40. The dielectric layer 34 can be patterned to open up contact openings 36 for contact formation. The contact openings 36 can provide a form for vias or a partial trench contact (partially strapped contacts).

A barrier layer 42 can be conformally deposited over the device 10. In one embodiment, the barrier layer 42 includes TiN. In other embodiments, the barrier layer can include Ta, TaN, or other suitable materials. The barrier layer 42 can be deposited by CVD although other deposition processes may be employed.

Figure 6:
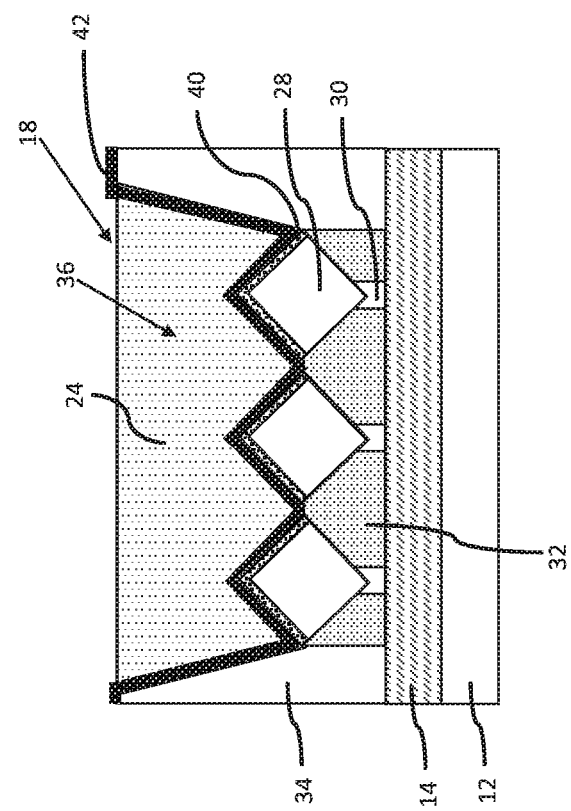
FIG. 6 is a cross-sectional view of the device of FIG. 5 showing the dielectric layer filled with metal to form a contact in accordance with an embodiment of the present invention.

Referring to FIG. 6, contacts 44 are formed by depositing a contact metal in the contact openings 36. Interconnect metallization is completed using liner, barrier and gapfill metal deposition followed by CMP planarization. In accordance with some embodiments, the liner can be omitted as well as a preclean process. The contacts 44 may include any suitable conductive material, such as a metal (e.g., tungsten, titanium, tantalum, ruthenium, cobalt, copper, aluminum, etc.), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The conductive material can contact successive S/D regions 28 in a fully strapped contact configuration, although a partially strapped configuration can also be employed depending on the contact resistance needed.

Figure 7:
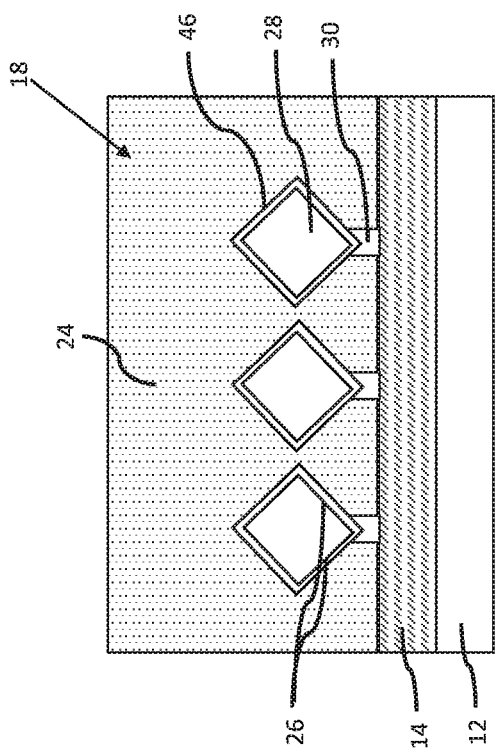
FIG. 7 is a cross-sectional view showing source/drain regions of a semiconductor device having non-merged diamond shapes with metal wrapped around the source/drain regions in accordance with an embodiment of the present invention.

Referring to FIG. 7, beginning with the structure of FIG. 2, in another embodiment, an early wrap around salicide embodiment is shown for a device 60. A silicide is formed that can wrap around the diamond structure of the S/D regions covering both the top and bottom facets 26, increasing the contact length and reducing the contact resistance.

A silicide metal 46 of desired thickness is deposited by one of a physical vapor deposition (PVD), chemical vapor deposition (CVD) or atomic layer deposition (ALD) process. The silicide metal 46 can include metals such as, e.g., Ti, Ta, Hf, Zr, Nb, alloys of these or other suitable metals that can be employed to form high temperature silicides. The silicide metal 46 can be selected for different devices. For example, PFETs and NFETs may employed different silicide metals 46. The silicide metal 46 is formed wrapped around the (111) facets 26 of the S/D regions 28 by providing a vapor or plasma that condenses or reacts on all facets 26.

S/D epitaxial regions 28 are in the shape of diamonds with (111) facets 26 not merged as merging these regions produces (100) facets, which should be avoided. This structure is thermally stable and provides full entitlement of contact length (even greater than the embodiments where only some facets are coated by metal) on all facets 26 of S/D regions 28 and ends of fins 30.

A local shallow trench isolation (LSTI) 32 is formed and etched as needed to cover the fins 30 and lower facets 26 of the S/D regions 28 as appropriate during the procedure. The LSTI 32 can include an oxide, such as silicon dioxide, although other dielectric materials can be employed.

Figure 8:
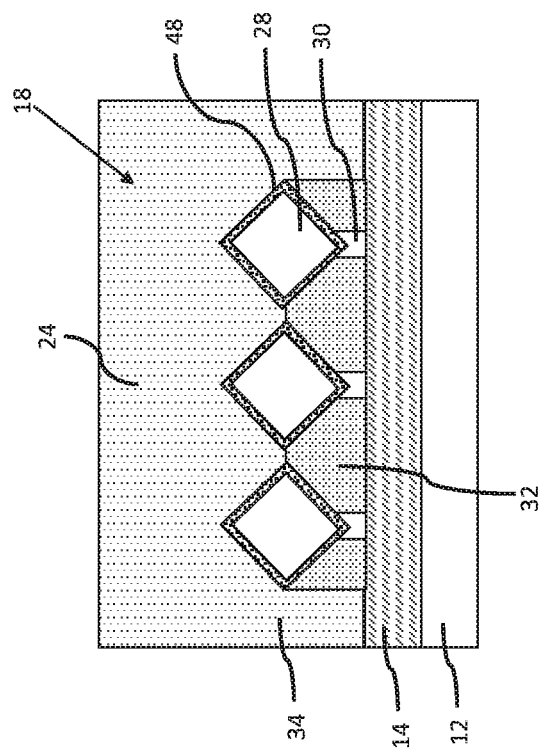
FIG. 8 is a cross-sectional view of the device of FIG. 7 showing a self-aligned silicide formed on top and bottom facets of the source/drain regions by annealing in accordance with an embodiment of the present invention.

Referring to FIG. 8, an anneal process is performed to react the metal 46 with the S/D regions 28. The anneal can include a rapid thermal anneal (RTA), a laser anneal (e.g., a laser spike anneal (LSA)) or a combination of anneals to form a salicide region 48. In one embodiment, a laser anneal includes a temperatures of between about 900 degrees C. to about 1100 degrees C. for between about 0.25 ms to about 1 ms. The selective removal of unreacted metal 46 is completed using a wet etch chemistry, e.g., a sulphuric peroxide mixture or a nitric acid etch. This quick anneal greatly increases thermal stability of the silicide. Additional annealing can be performed to provide sufficient silicide mixing.

Referring to FIG. 9, a dielectric layer 34 is formed over the device 10. The dielectric layer 34 can include an ultra-low-k (ULK) dielectric, although any suitable dielectric material can be employed. The dielectric layer 34 forms a middle of the line (MOL) interlevel dielectric layer (ILD). The dielectric layer 34 is planarized using, e.g., a chemical mechanical polish (CMP) process.

The gate structures 18 are then processed by performing a CMP process to open up the gate structures 18 to remove the dummy gate and perform replacement metal gate processing. For example, remove the dummy gate and gate oxide and replace the gate oxide with a gate dielectric and the dummy gate with a gate conductor.

Contact openings 36 are etched in accordance with an etch mask pattern to land on the S/D silicide regions 48. The dielectric layer 34 can be patterned to open up contact openings 36 for contact formation. The contact openings 36 can provide a form for vias or a partial trench contact (partially strapped).

A barrier layer 42 can be conformally deposited over the device 60. In one embodiment, the barrier layer 42 includes TiN. In other embodiments, the barrier layers can include Ta, TaN, or other suitable materials. The barrier layer 42 can be deposited by CVD although other deposition processes may be employed.

Referring to FIG. 10, contacts 50 are formed by depositing a contact metal in the contact openings 36. Interconnect metallization is completed using liner, barrier and gapfill metal deposition followed by CMP planarization. The contacts 50 may include any suitable conductive material, such as a metal (e.g., tungsten, titanium, tantalum, ruthenium, cobalt, copper, aluminum, etc.), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. The contacts 50 can be fully strapped as depicted in FIG. 10, but can be partially strapped depending on the contact resistance needed.

Figure 11:
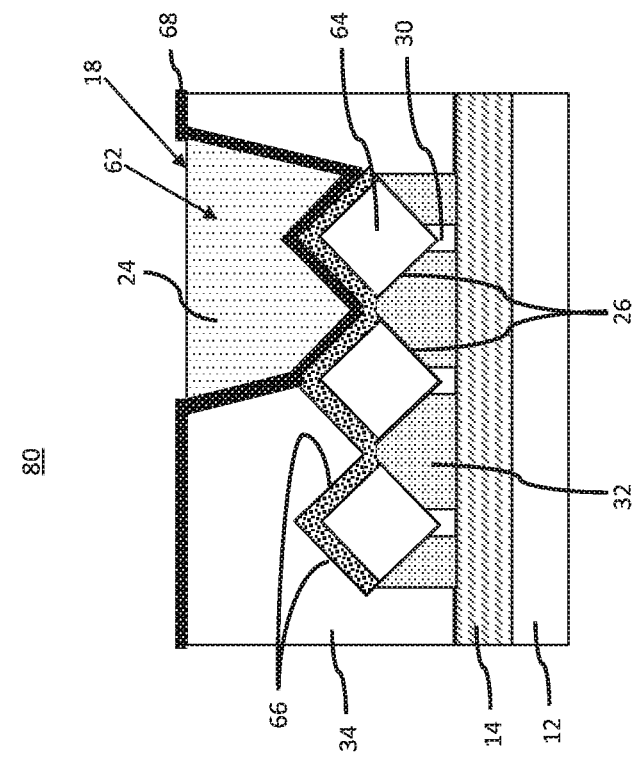
FIG. 11 is a cross-sectional view showing a self-aligned silicide formed over and between non-merged source/drain regions by annealing in accordance with an embodiment of the present invention.

Referring to FIG. 11, in another embodiment, an early merged silicide with a partial contact (partially strapped) embodiment is shown for a device 80. A silicide metal of desired thickness is deposited by one of a physical vapor deposition (PVD), chemical vapor deposition (CVD) or atomic layer deposition (ALD) process. The silicide metal can include metals such as, e.g., Ti, Ta, Hf, Zr, Nb, alloys of these or other suitable metals can be employed to form high temperature silicides. The silicide metal can be selected for different devices. For example, PFETs and NFETs may employed different silicide metals. The silicide metal is formed over upper (111) facets 26 of the S/D regions 64.

S/D epitaxial regions 64 are in the shape of diamonds with (111) facets 26 not merged as merging these regions produce (100) facets which should be avoided. However, these regions 64 are formed as close as possible without merging the S/D regions 64. This structure is thermally stable and provides full entitlement of contact length over the facets 26 of S/D regions 64 and ends of fins 30.

A local shallow trench isolation (LSTI) 32 is formed and etched to cover the fins 30 and lower facets 26 of the S/D regions 64 prior to metal deposition. The LSTI 32 can include an oxide, such as silicon dioxide, although other dielectric materials can be employed.

An anneal process is performed to react the metal with the S/D regions 64 to form silicide regions 66. The anneal can include a rapid thermal anneal (RTA), a laser anneal (e.g., a laser spike anneal (LSA)) or a combination of anneals to form a salicide region 48. In one embodiment, a laser anneal includes a temperature of between about 900 degrees C. to about 1100 degrees C. for between about 0.25 ms to about 1 ms. Since the metal is formed over the facets 26 and the corners of the facets are so close, the siliciding process merges the silicide between the separate S/D regions 64. The selective removal of unreacted metal is completed using a wet etch chemistry, e.g., a sulphuric peroxide mixture or a nitric acid etch. This quick anneal greatly increases thermal stability of the silicide. Additional annealing can be performed to provide sufficient silicide mixing.

Figure 12:
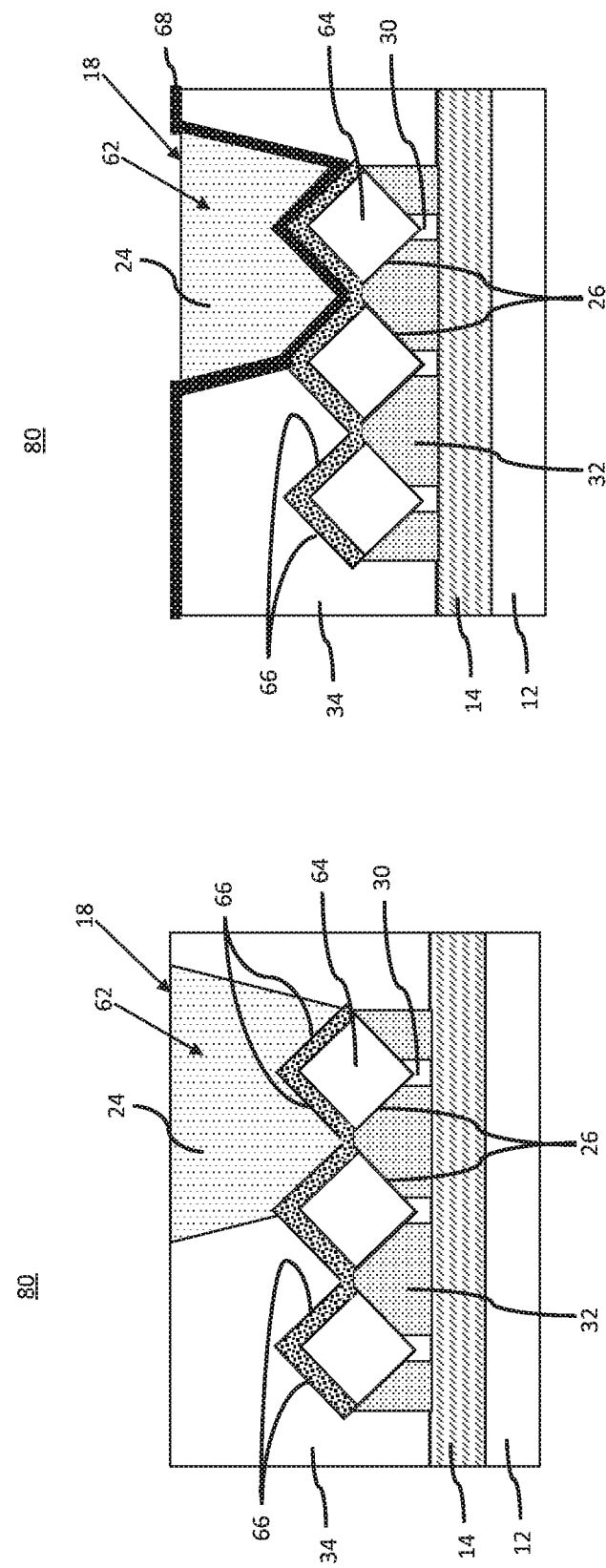
FIG. 12 is a cross-sectional view of the device of FIG. 11 showing a dielectric layer opened up to form a partial contact hole and a barrier layer conformally formed in accordance with an embodiment of the present invention.

Referring to FIG. 12, a dielectric layer 34 is formed over the device 80. The dielectric layer 34 can include an ultra-low-k (ULK) dielectric, although any suitable dielectric material can be employed. The dielectric layer 34 forms a middle of the line (MOL) interlevel dielectric layer (ILD). The dielectric layer 34 is planarized using, e.g., a chemical mechanical polish (CMP) process.

The gate structures 18 are then processed by performing a CMP process to open up the gate structures 18 to remove the dummy gate and perform replacement metal gate processing. For example, remove the dummy gate and gate oxide and replace the gate oxide with a gate dielectric and the dummy gate with a gate conductor.

Contact openings 62 are etched in accordance with an etch mask pattern to land on the S/D silicide regions 64. The dielectric layer 34 can be patterned to open up contact openings 62 for contact formation. The contact openings 62 can provide a form for vias (fully strapped) or a partial trench contact (partially strapped).

A barrier layer 68 can be conformally deposited over the device 80. In one embodiment, the barrier layer 68 includes TiN. In other embodiments, the barrier layers can include Ta, TaN, or other suitable materials. The barrier layer 68 can be deposited by CVD although other deposition processes may be employed.

Figure 13:
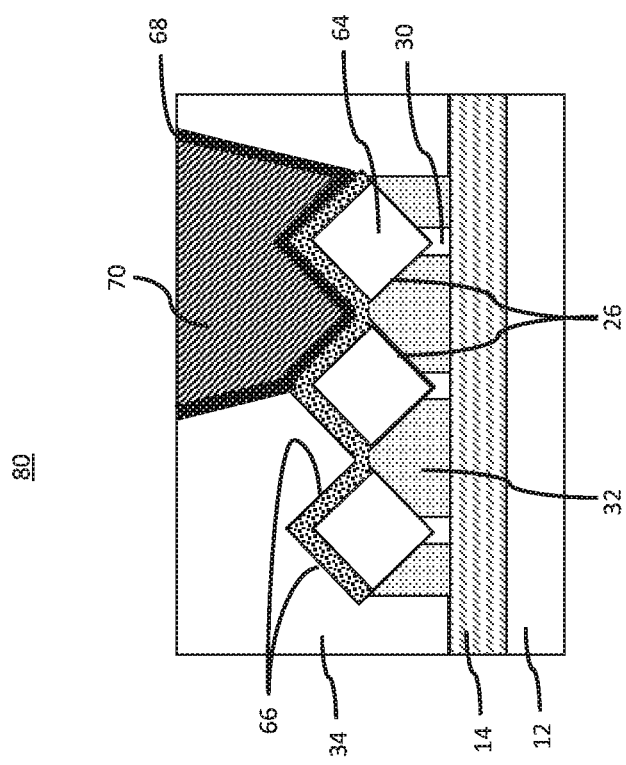
FIG. 13 is a cross-sectional view of the device of FIG. 12 showing the dielectric layer filled with metal to form a partial contact (partial strap) in accordance with an embodiment of the present invention.

Referring to FIG. 13, contacts 70 are formed by depositing a contact metal in the contact openings 62. Interconnect metallization is completed using liner, barrier and gapfill metal deposition followed by CMP planarization. The liner can be omitted as well as a preclean process for this or any of the embodiments of the present invention. The contacts 70 may include any suitable conductive material, such as a metal (e.g., tungsten, titanium, tantalum, ruthenium, cobalt, copper, aluminum, etc.), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further include dopants that are incorporated during or after deposition.

The contact 70 partially straps S/D regions 64 covering less than all of the S/D regions 64. However, the S/D regions are connected through the silicide 66. The partial strap formed by contact 70 reduces the capacitance between the contact 70 and a gate structure conductor 84 (FIG. 14) and helps reduce the total effective capacitance of the device 80. In contrast, in typical trench silicide (TS) contacts, local interconnects strap a whole width (fully strapped) of the S/D regions and add significantly to effective capacitance. As dimensions are scaled down in advanced FinFET technologies, this has a larger effect. (It should be understood that the contacts 44, 50 and 70 can include any type of contact, e.g., trench silicide (TS), first metal layer contacts (CA), upper level contacts or vias (C1, C2, etc.) or other local interconnects. The contacts 44, 50 and 70 can be fully strapped, partially strapped or a combination of both with partially strapped being preferred where low capacitance has greater weight.

Figure 14:
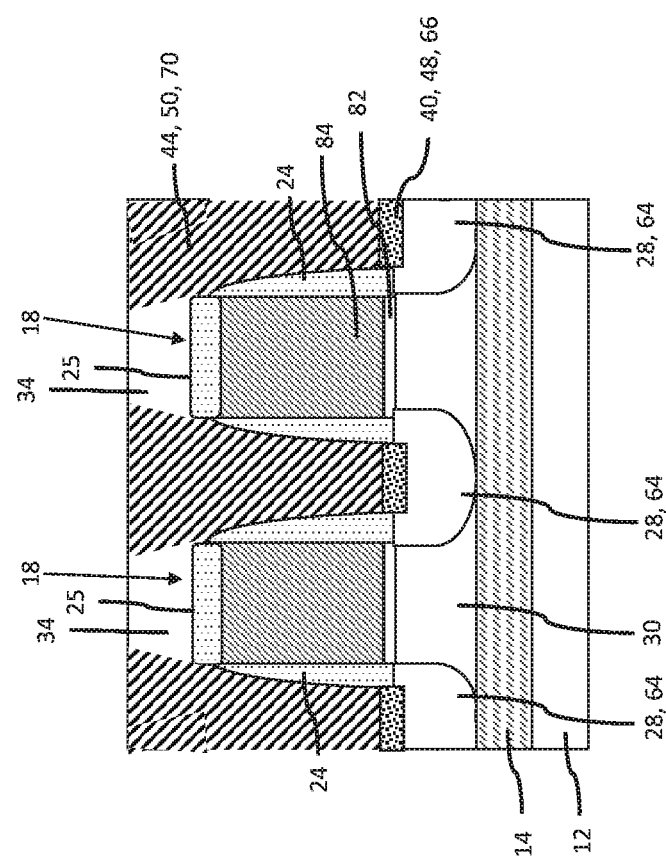
FIG. 14 is a cross-sectional view taken transversely through gate structures of a semiconductor device showing contacts self-aligned between the gate structures contacting silicide regions in accordance with an embodiment of the present invention.

Referring to FIG. 14, a cross-sectional view through the gate structures 18 is illustratively shown after metal gate replacement. Gate structures 18 include a gate dielectric 82, gate conductor 84, cap 25 and spacers 24. Self-aligned silicides (salicides) 40, 48, 66 are formed between the gates 18 on the S/D regions 28, 64. The dummy gate is replaced in a replacement metal gate (RMG) processing scheme. In such as process, the gate dielectric and the dummy gate are replaced after processing source and drain regions.

Since salicide is formed prior to the replacement metal gate deposition, higher thermal budgets can be used for silicide formation. This permits for thicker metal deposition and thus a thicker silicide formation. This is particularly useful in cases where a Si cap is employed on top of a SiGe S/D epi (PFET) to ensure full consumption of the Si cap for silicide formation.

In trench contacts, thicker liner metal deposition takes away volume available for gap fill metallization. In accordance with the present embodiments, use of liner metals is optional and can be avoided with the use of high temperature silicides. When RMG is employed, constraints placed on higher thermal budgets are relaxed for forming thicker silicide films since the salicides are formed prior to the RMG process.

Metals such as Ti, Ta, Hf, Zr, and Nb or alloys of these can be used to form high temperature silicides. High temperature millisecond and nanosecond laser anneals can be employed to form the silicides. The laser anneal can be combined with additional RTA anneals either before or after the laser anneal. Localized annealing opens up the thermal budget as well. Early silicide formation permits high temperatures to be employed for silicide formation, which, in turn, permits more thermal budget for the RMG process (or other processing) since the silicides are more stable.

Unreacted metal can be removed from the top of the S/D regions 28, 64, sidewalls and the field regions by using a wet chemistry (for example, sulphuric peroxide mixture) that selectively removes the metal but does not etch the silicide films. The thickness of the silicides can be between about 2 nm to about 15 nm, although larger thicknesses can be employed.

Figure 15:
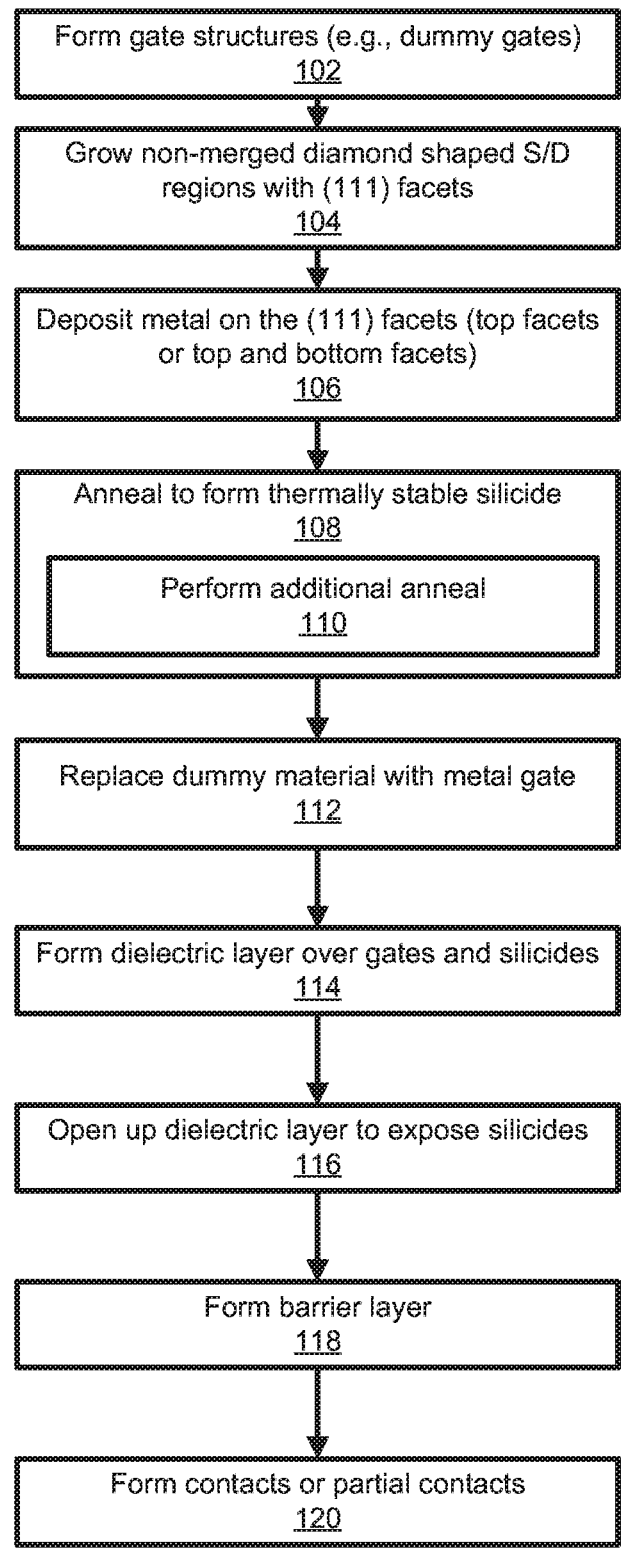
FIG. 15 is a block/flow diagram showing methods for forming salicides, in accordance with an embodiment of the present invention.

Referring to FIG. 15, methods for forming a salicide are illustratively shown. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, gate structures with a dummy gate material are formed. The gate structures can include a gate dielectric, a dummy gate material, sidewall spacers and a cap on the dummy gate material. The gate structures run transversely to semiconductor fins formed on a SOI or bulk substrate. The gate structures separate a source region from a drain region for a particular device.

In block 104, source/drain (S/D) regions are epitaxially grown on a semiconductor fin wherein the S/D regions include (111) facets in a diamond shape. The S/D regions can include Si, SiGe or other Si-containing material epitaxially grown to form the diamond shapes having the (111) facets. The diamond shapes of the S/D regions are separated in a non-merged configuration. The non-merged configuration avoids (100) orientated material that leads to increased resistivity.

In block 106, a metal is deposited on the (111) facets. In one embodiment, this can include forming the metal on the top facets. In another embodiment, facets about the diamond shape are covered in metal (wrap around configuration (e.g., top and bottom facets)). The silicide can include a metal selected from the group consisting of Ti, Ta, Hf, Zr, Nb and alloys of these. These metals can form high temperature (i.e., thermally stable) silicides.

In block 108, annealing of the metal on the S/D regions is performed to form a silicide on the (111) facets. This includes a thermally stabilizing anneal process to anneal the metal on the S/D regions to form the silicide on the (111) facets. The thermally stabilizing anneal can include a rapid and localized anneal to make the silicide stabile and prevent reaction under subsequent semiconductor processing, e.g., metal gate replacement processing or the like. Thermal stability includes maintaining the silicide's structure under high temperature conditions. Annealing the metal can include annealing with a laser anneal at a temperature of between about 900 to 1100 degrees C. for less than or equal to 1 millisecond to thermally stabilize the silicide. Additional annealing can be employed before or after the thermally stabilizing anneal to continue to form the silicide or for other reasons.

In block 110, in one embodiment, annealing the metal can include forming merged silicides between the S/D regions.

In block 112, a dummy gate material can be replaced with a metal gate conductor after the annealing step. This high temperature process can be performed after the silicide formation since the silicide is thermally stable. This step is optional depending on the device and processing chosen. In this way, the salicide is formed "early" and can withstand the temperatures needed for RMG processing without significant degradation.

In block 114, a dielectric layer is formed over the S/D regions and gate structures.

In block 116, the dielectric layer is opened up (e.g., patterned and etched) to expose the silicide and to form contact holes. In one embodiment, opening up the dielectric layer to expose the silicide and to form contact holes can include opening up the dielectric layer to expose the silicide over a portion of the S/D regions (partially strapped).

In block 118, a conformal barrier layer can be formed in the contact holes.

In block 120, contacts (fully or partially strapped) to the silicide are formed in the contact holes. In one embodiment, the contacts to the silicide in the contact holes can include partial contacts. Partial contacts are formed to the silicide for only a portion of the S/D regions. The partial contacts skip contacting silicides of one or more S/D regions in a series of adjacent S/D regions to reduce capacitance.

Having described preferred embodiments for thermally stable salicide formation for salicide first contacts (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for forming a salicide, comprising:
epitaxially growing source/drain (S/D) regions having a cross-sectional quadrilateral diamond shape on semiconductor fins, wherein the S/D regions include (111) facets, and the S/D regions on adjacent semiconductor fins have separated cross-sectional quadrilateral diamond shapes;
depositing a metal on the (111) facets;
performing a thermally stabilizing anneal process to anneal the metal on the (111) facets of the S/D regions to form a silicide on the (111) facets;
forming a dielectric layer over the S/D regions;
opening up the dielectric layer to expose the silicide and to form contact holes; and
forming contacts to the silicide in the contact holes.

2. The method as recited in claim 1, wherein the cross-sectional quadrilateral diamond shapes of the S/D regions are separated in a non-merged configuration.

3. The method as recited in claim 1, wherein depositing the metal on the (111) facets includes depositing the metal on top side facets of the (111) facets of the S/D regions.

4. The method as recited in claim 1, wherein depositing the metal on the (111) facets includes depositing the metal on all facets of the S/D regions in a wrapped around configuration.

5. The method as recited in claim 1, wherein performing the thermally stabilizing anneal process includes forming merged silicides between the S/D regions.

6. The method as recited in claim 1, wherein opening up the dielectric layer to expose the silicide and to form contact holes includes opening up the dielectric layer to expose the silicide over a portion of the S/D regions.

7. The method as recited in claim 6, wherein forming contacts to the silicide in the contact holes includes forming the contacts to the silicide in the contact holes for the portion of the S/D regions to reduce capacitance so that the contacts are a partially strapped configuration.

8. The method as recited claim 1, wherein performing the thermally stabilizing anneal process includes annealing with a laser anneal at a temperature of between about 900 to 1100 degrees C. for less than or equal to 1 millisecond.

9. The method as recited in claim 8, further comprising performing an additional anneal process to continue to form the silicide.

10. A method for forming a salicide, comprising:
forming gate structures with a dummy gate material;
epitaxially growing source/drain (S/D) regions having a cross-sectional quadrilateral diamond shape on semiconductor fins, wherein the S/D regions include (111) facets, and the S/D regions on adjacent semiconductor fins have separated cross-sectional quadrilateral diamond shapes;
depositing a metal on the (111) facets;
annealing the metal on the (111) facets of the S/D regions to form a silicide on the (111) facets;
replacing the dummy gate material with a metal gate conductor after the annealing step;
forming a dielectric layer over the S/D regions;
opening up the dielectric layer to expose the silicide and to form contact holes; and
forming contacts to the silicide in the contact holes.

11. The method as recited in claim 10, wherein the cross-sectional quadrilateral diamond shapes of the S/D regions are separated in a non-merged configuration.

12. The method as recited in claim 10, wherein depositing the metal on the (111) facets includes depositing the metal on top side facets of the (111) facets of the S/D regions.

13. The method as recited in claim 10, wherein depositing the metal on the (111) facets includes depositing the metal on all facets of the S/D regions in a wrapped around configuration.

14. The method as recited in claim 10, wherein annealing the metal includes forming merged silicides between the S/D regions.

15. The method as recited in claim 10, wherein opening up the dielectric layer to expose the silicide and to form contact holes includes opening up the dielectric layer to expose the silicide over a portion of the S/D regions.

16. The method as recited in claim 15, wherein forming contacts to the silicide in the contact holes includes forming the contacts to the silicide in the contact holes for the portion of the S/D regions to reduce capacitance so that the contacts are in a partially strapped configuration.

17. The method as recited in claim 10, wherein annealing the metal includes annealing with a laser anneal at a temperature of between about 900 to 1100 degrees C. for less than or equal to 1 millisecond to thermally stabilize the silicide.

18. The method as recited in claim 17, further comprising performing an additional anneal process to continue to form the silicide.

* * * * *